United States Patent
Besser et al.

(10) Patent No.: US 6,703,308 B1
(45) Date of Patent: Mar. 9, 2004

(54) METHOD OF INSERTING ALLOY ELEMENTS TO REDUCE COPPER DIFFUSION AND BULK DIFFUSION

(75) Inventors: Paul R. Besser, Sunnyvale, CA (US); Matthew S. Buynoski, Palo Alto, CA (US); Sergey D. Lopatin, Santa Clara, CA (US); Alline F. Myers, Santa Clara, CA (US); Phin-Chin Connie Wang, Menlo Park, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 36 days.

(21) Appl. No.: 09/994,400

(22) Filed: Nov. 26, 2001

(51) Int. Cl.⁷ ................... H01L 21/44; H01L 21/4763
(52) U.S. Cl. ................. 438/659; 438/627; 438/639; 438/643; 438/648; 438/653; 438/656; 438/658; 438/687
(58) Field of Search ............... 438/687, 653, 438/658, 659, 627, 639, 643, 648, 656, 685

(56) References Cited

U.S. PATENT DOCUMENTS

| | | | |
|---|---|---|---|
| 5,004,520 A | | 4/1991 | Tsuji et al. |
| 5,243,222 A | | 9/1993 | Harper et al. ............... 257/774 |
| 5,300,462 A | * | 4/1994 | Kakumu ..................... 438/659 |
| 5,552,341 A | * | 9/1996 | Lee .......................... 438/643 |
| 5,654,245 A | * | 8/1997 | Allen ........................ 438/629 |
| 5,770,517 A | * | 6/1998 | Gardner et al. ............. 438/627 |
| 5,821,168 A | | 10/1998 | Jain .......................... 438/692 |
| 5,882,738 A | * | 3/1999 | Blish et al. ................. 427/526 |
| 5,899,740 A | * | 5/1999 | Kwon ......................... 438/627 |
| 5,969,422 A | | 10/1999 | Ting et al. .................. 257/762 |
| 6,015,749 A | * | 1/2000 | Liu et al. .................... 438/628 |
| 6,030,895 A | | 2/2000 | Joshi et al. |
| 6,069,068 A | | 5/2000 | Rathore et al. ............. 438/628 |
| 6,090,710 A | | 7/2000 | Andricacos et al. ........ 438/687 |
| 6,096,648 A | * | 8/2000 | Lopatin et al. ............. 438/687 |
| 6,117,770 A | * | 9/2000 | Pramanick et al. ......... 438/659 |
| 6,156,638 A | * | 12/2000 | Agarwal et al. ............ 438/627 |
| 6,180,522 B1 | * | 1/2001 | Hong ......................... 438/659 |
| 6,225,221 B1 | | 5/2001 | Ho et al. .................... 438/678 |

(List continued on next page.)

FOREIGN PATENT DOCUMENTS

| | | |
|---|---|---|
| EP | 0 567 867 A2 | 11/1993 |
| EP | 1 039 531 A2 | 9/2000 |
| EP | 1 039 531 A3 | 12/2000 |
| EP | 1 094 515 A2 | 4/2001 |

OTHER PUBLICATIONS 4.7.3 General Reliability Issues Associated with IC Interconnects, Silicon Processing For the VLSI Era, vol. II, pp. 264–265. 1990.

James A. Cunningham, "Improving Copper Interconnects: A Search for Useful Dopants," Semiconductor International, (Apr. 2000), pp. 1–8.

(List continued on next page.)

*Primary Examiner*—Matthew Smith
*Assistant Examiner*—Lex H Malsawma
(74) *Attorney, Agent, or Firm*—Foley & Lardner

(57) ABSTRACT

A method of fabricating an integrated circuit can include forming a barrier material layer along lateral side walls and a bottom of a via aperture which is configured to receive a via material that electrically connects a first conductive layer and a second conductive layer, implanting a first alloy element into the barrier material layer, and implanting a second alloy element after deposition of the via material. The implanted first alloy element makes the barrier material layer more resistant to copper diffusion. The implanted second alloy element diffuses to a top interface of the via material and reduces bulk diffusion from the via material.

20 Claims, 3 Drawing Sheets

U.S. PATENT DOCUMENTS

| | | | |
|---|---|---|---|
| 6,242,808 B1 | | 6/2001 | Shimizu et al. ............. 257/762 |
| 6,268,291 B1 | * | 7/2001 | Andricacos et al. ........ 438/694 |
| 6,294,463 B1 | * | 9/2001 | Tseng ......................... 438/643 |
| 6,294,836 B1 | | 9/2001 | Paranjpe et al. ............ 257/767 |
| 6,297,146 B1 | * | 10/2001 | Lopatin ...................... 438/625 |
| 6,344,413 B1 | | 2/2002 | Zurcher et al. ............. 438/678 |
| 6,365,502 B1 | | 4/2002 | Paranjpe et al. ............ 438/622 |
| 6,399,496 B1 | | 6/2002 | Edelstein et al. ........... 438/687 |
| 6,410,383 B1 | | 6/2002 | Ma ............................ 438/247 |
| 6,420,262 B1 | | 7/2002 | Farrar ........................ 438/652 |
| 6,423,633 B1 | * | 7/2002 | Tseng ......................... 438/653 |
| 6,426,289 B1 | * | 7/2002 | Farrar ........................ 438/670 |
| 6,461,675 B2 | | 10/2002 | Paranjpe et al. ............ 427/250 |
| 6,465,867 B1 | * | 10/2002 | Bernard et al. ............. 257/520 |
| 6,482,734 B1 | * | 11/2002 | Ha et al. ..................... 438/643 |
| 6,482,740 B2 | | 11/2002 | Soininen et al. ............ 438/686 |
| 6,500,749 B1 | * | 12/2002 | Liu et al. .................... 438/618 |
| 6,521,532 B1 | | 2/2003 | Cunningham ............... 438/687 |
| 6,534,865 B1 | | 3/2003 | Lopatin et al. ............. 257/751 |
| 2001/0035237 A1 | | 11/2001 | Nagano et al. ............. 148/430 |
| 2002/0036309 A1 | | 3/2002 | Sekiguchi et al. .......... 257/301 |
| 2002/0039542 A1 | | 4/2002 | Bogel et al. ................ 420/492 |
| 2002/0053741 A1 | | 5/2002 | Iwasaki et al. ............. 257/762 |
| 2002/0084529 A1 | | 7/2002 | Dubin et al. ................ 257/774 |
| 2002/0102838 A1 | | 8/2002 | Paranjpe et al. ............ 438/622 |
| 2002/0109233 A1 | | 8/2002 | Farrar ........................ 257/762 |
| 2002/0115292 A1 | | 8/2002 | Andricacos et al. ........ 438/687 |
| 2002/0137332 A1 | | 9/2002 | Paranjpe et al. ............ 438/637 |

OTHER PUBLICATIONS

Dong Joon Kim et al, "New Method to Prepare W–B$^+$–N Ternary Barrier to Cu diffusion by Implanting BF$_2^+$ Ions Into W–N Thin Film," J. Vac. Sci. Technol. B 17(4), Jul./Aug., 1999, pp. 1598–1601.

W. F. McArthur et al., "Structural and Electrical Characterization of Si–Implanted Tin as a Diffusion Barrier for Cu Metallization," Mat. Res. Soc. Symp. Proc. vol. 391, 1995, pp. 327–332.

PCT Intetnational Search Report, International Application No. PCT/US02/32605, International Filing Date Nov. 10, 2002 (7 pages).

PCT International Search Report, International Application No. PCT/US 02/32554, International Filing Date Nov. 10, 2002 (5 pages).

\* cited by examiner

METHOD OF INSERTING ALLOY ELEMENTS TO REDUCE COPPER DIFFUSION AND BULK DIFFUSION

CROSS REFERENCE TO RELATED APPLICATIONS

This application is related to U.S. patent application Ser. No. 09/994,397, entitled METHOD OF IMPLANTING COPPER BARRIER MATERIAL TO IMPROVE ELECTRICAL PERFORMANCE; U.S. patent application Ser. No. 09/994,358, entitled METHOD OF IMPLANTATION AFTER COPPER SEED DEPOSITION; U.S. patent application Ser. No. 09/994,395, entitled METHOD OF USING TERNARY COPPER ALLOY TO OBTAIN A LOW RESISTANCE AND LARGE GRAIN SIZE INTERCONNECT; and U.S. patent application Ser. No. 10/123,751, entitled USE OF ULTR-LOW ENERGY ION IMPLANTATION (ULEII) TO FORM ALLOY LAYERS IN COPPER which are all assigned to the same assignee as this application.

FIELD OF THE INVENTION

Copper layer 435 can be a layer of copper positioned in proximate location to via section 420. Copper layer 435 can be an alloy including copper (Cu). In an alternative embodiment, copper layer 435 is a stack of several layers.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to fabricate millions of IC devices on an IC, there is still a need to decrease the size of IC device features, and, thus, increase the number of devices on an IC. Nevertheless, there are many factors that make the continued miniaturization of ICs difficult. For example, as the size of vias (or pathways between integrated circuit layers used to electrically connect separate conductive layers) decreases, electrical resistance increases.

One way by which integrated circuit (IC) manufacturers have attempted to reduce via resistance as the via size decreases is reducing the thickness of the barrier material. For example, IC manufacturers can try to make the barrier material very thin at the bottom of the via. The thickness of the barrier material can be reduced by chemical vapor deposition (CVD) or advanced plasma vapor deposition (PVD) processes. Nevertheless, reducing the barrier thickness causes the barrier to become more permeable to copper (Cu) diffusion, which can adversely affect resistance to electromigration (EM).

FIG. 1 illustrates a schematic cross-sectional view of a portion 100 of an integrated circuit including a copper layer 110, a via 120, and a copper layer 130. Via 120 and copper layer 130 are separated by a barrier layer 140. Copper layer 110 and via 120 can be one structure when formed in a dual in-laid process or, alternatively, two structures when formed in a single in-laid process. Barrier layer 140 inhibits diffusion of copper ions in general. Conventional barrier layers can include Tantalum Nitride (TaN).

Portion 100 also includes a dielectric layer 142 that is separated from copper layer 130 by an etch stop layer 144. Dielectric layer 142 can be oxide and etch stop layer 144 can be Silicon Nitride (SiN). Etch stop layer 144 prevents diffusion of copper from copper layer 130 into dielectric layer 142.

As discussed above, conventional systems have attempted to reduce the thickness of barrier layer 140 to reduce the resistance associated with via 120. However, this reduction in thickness can cause electromigration (EM) failures. FIG. 2 illustrates portion 100 described with reference to FIG. 1, further having an EM failure 145 in copper layer 130. FIG. 3 illustrates portion 100 having an EM failure 155 in via 120 due to bulk diffusion from copper layer 110.

EM failures have been described by Stanley Wolf, Ph.D. in *Silicon Processing for the VLSI Era*, Vol. 2, pp. 264–65. Dr. Wolf explains that a positive divergence of the motion of the ions of a conductor leads to an accumulation of vacancies, forming a void in the metal. Such voids may ultimately grow to a size that results in open-circuit failure of the conductor line.

Thus, there is a need for a barrier that is more resistant to copper diffusion and thin enough for low via resistance. Further, there is a need for a method of implanting copper barrier material and bulk barrier material to improve electrical performance. Even further, there is a need for a method of enhancing barrier properties by inserting alloy elements to reduce copper diffusion and bulk diffusion.

SUMMARY OF THE INVENTION

An exemplary embodiment is related to a method of fabricating an integrated circuit. This method can include forming a barrier material layer along lateral side walls and a bottom of a via aperture which is configured to receive a via material that electrically connects a first conductive layer and a second conductive layer, implanting a first alloy element into the barrier material layer, and implanting a second alloy element after deposition of the via material. The implanted first alloy element can make the barrier material layer more resistant to copper diffusion. The implanted second alloy element diffuses to a top interface of the via material and reduces interface diffusion from the via material.

Another exemplary embodiment is related to a method of implanting copper barrier material to improve electrical performance in an integrated circuit fabrication process. This method can include providing a copper layer over an integrated circuit substrate, providing a barrier material at a bottom and sides of a via aperture positioned over the copper layer to form a barrier material layer separating the via aperture from the copper layer, amorphizing the barrier material layer thereby making the barrier material layer more resistant to copper diffusion from the copper layer, and filling the via aperture with a via material and an alloy element that diffuses to a top interface of the via material.

Another exemplary embodiment is related to a method of forming a via in an integrated circuit. This method can include depositing a copper layer, depositing an etch stop layer over the copper layer, depositing an insulating layer over the etch stop layer, forming an aperture in the insulating layer and the etch stop layer, providing a barrier material at a bottom and sides of the aperture form a barrier material layer providing separation from the copper layer, implanting a first alloy element into the barrier material layer, filling the aperture with a via material and a second alloy element to form a via, and providing a conductive layer over the via such that the via electrically connects the conductive layer to the copper layer. The implanted first alloy element can make the barrier material layer more resistant to copper diffusion from the copper layer. The second allow element can diffuse to a top interface to reduce copper diffusion.

Other principle features and advantages of the invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE EXEMPLARY EMBODIMENTS

Figure 1:
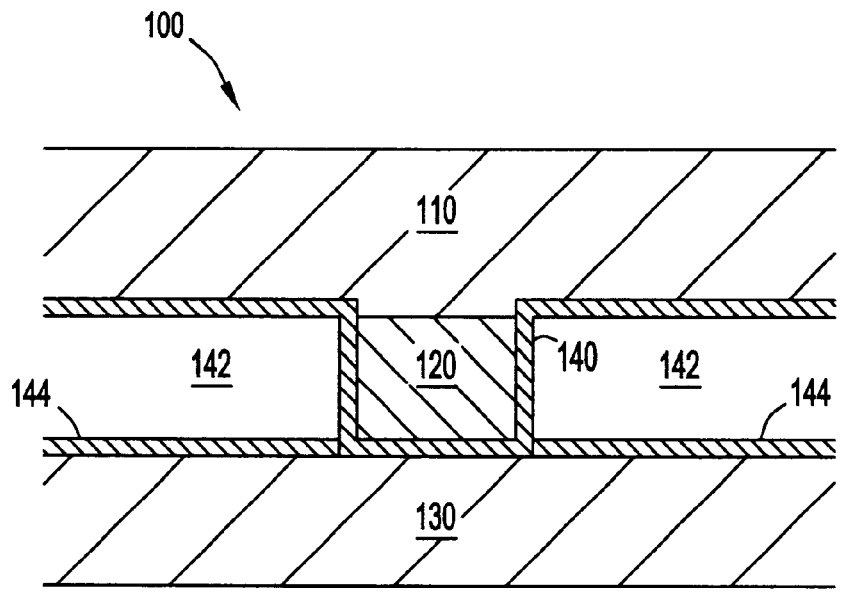
FIG. 1 is a schematic cross-sectional view representation of a portion of an integrated circuit fabricated in accordance with prior art.
Figure 2:
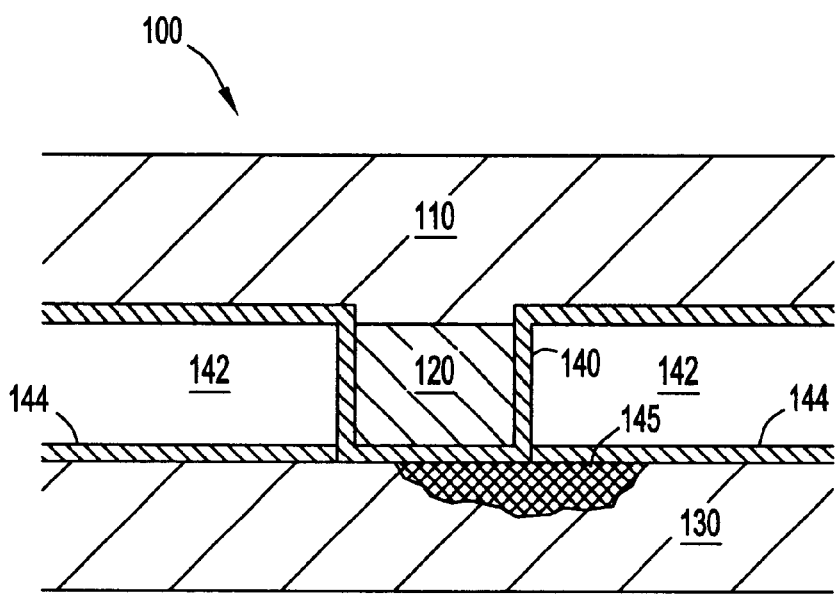
FIG. 2 is a schematic cross-sectional view representation of the portion of the integrated circuit illustrated in FIG. 1, showing an electromigration (EM) failure.
Figure 3:
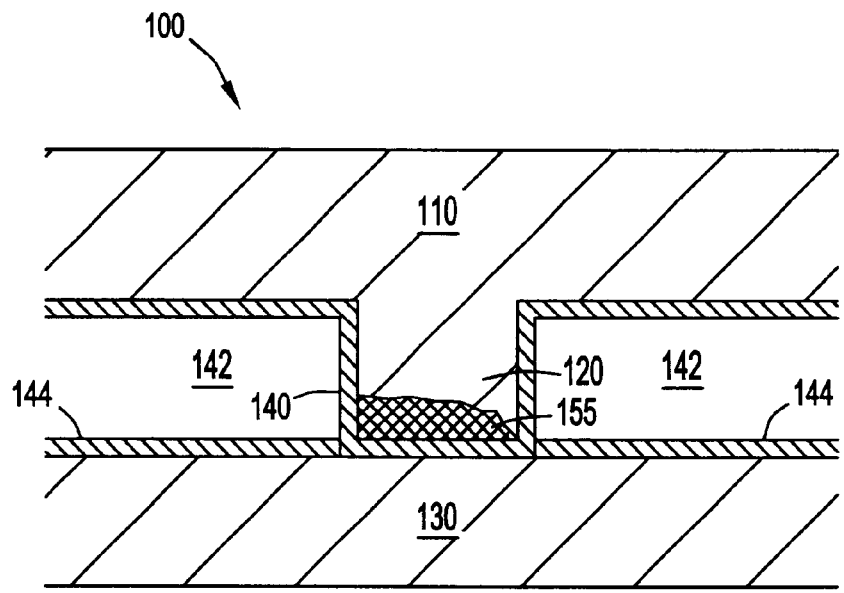
FIG. 3 is a schematic cross-sectional view representation of the portion of the integrated circuit illustrated in FIG. 1, showing an electromigration (EM) failure.
Figure 4:
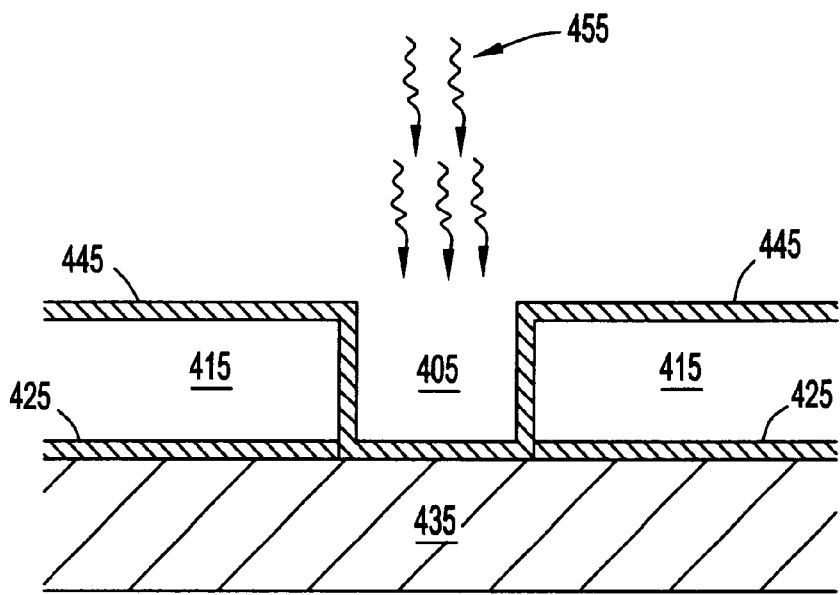
FIG. 4 is a schematic cross-sectional view representation of a portion of an integrated circuit, showing a slow diffusing insert in accordance with an exemplary embodiment.

With reference to FIG. 4, a schematic cross-sectional view representation of a portion 400 of an integrated circuit (IC) includes an aperture 405, a dielectric layer 415, an etch stop layer 425, a copper layer 435, and a barrier layer 445. Portion 400 is preferably part of an ultra- large-scale integrated (ULSI) circuit having millions or more transistors. Portion 400 is manufactured as part of the IC on a semiconductor wafer, such as, a silicon wafer.

Aperture 405 is formed in preparation for the creation of a via by etching a portion of dielectric layer 415 and etch stop layer 425. In an exemplary embodiment, dielectric layer 415 is an oxide material and etch stop layer 425 is Silicon Nitride (SiN) or other suitable material. Etch stop layer 425 prevents diffusion of copper from copper layer 435 into dielectric layer 415.

Copper layer 435 can be a layer of copper positioned in proximate location to via section 420. Copper layer 435 can be an alloy including copper (Cu). In an alternative embodiment, copper layer 430 is a stack of several layers.

Barrier layer 445 can be Tantalum (Ta), Titanium Nitride (TiN), Titanium Silicon Nitride (TiSiN), Tungsten Nitride (WNx), or other suitable material. In an exemplary embodiment, barrier layer 445 has a cross sectional thickness of 80 Angstroms. In other embodiments, barrier layer 445 can have dimensions as small as 25 Angstroms. The barrier properties of barrier layer 445 can be enhanced by the addition of an implant.

In an exemplary method of fabricating portion 400, once copper layer 435 is created, etch stop layer 425 is deposited over copper layer 435 and dielectric layer 415 is deposited over etch stop layer 425. A resist layer is then deposited over dielectric layer 415. The resist layer is used in the patterning and etching in dielectric layer 415 and etch stop layer 425 to form aperture 405. The resist layer is removed before depositing via material in aperture 405 and depositing a conductive layer electrically connected to copper layer 435 by the via.

Before depositing via material in aperture 405, an alloy element 455 can be inserted to diffuse into barrier layer 445. In an exemplary embodiment, alloy element 455 is inserted at the barrier interface after physical vapor deposition (PVD) or chemical vapor deposition (CVD). Alloy element 455 can be a slow diffuser in copper, such as, Zirconium (Zr), Lanthanum (La), Hafnium (CuHf), or other suitable material. The amount of alloy element 455 inserted can be a dose of 2 $e^{14}$/cm$^2$ or 2 $e^{15}$/cm$^2$ and inserted at an energy of, for example, 0.5 to 5 keV.

Advantageously, alloy element 455 provides for an improved copper barrier at barrier layer 445. Making barrier layer 445 more resistant to copper diffusion is good for electromigration.

Figure 5:
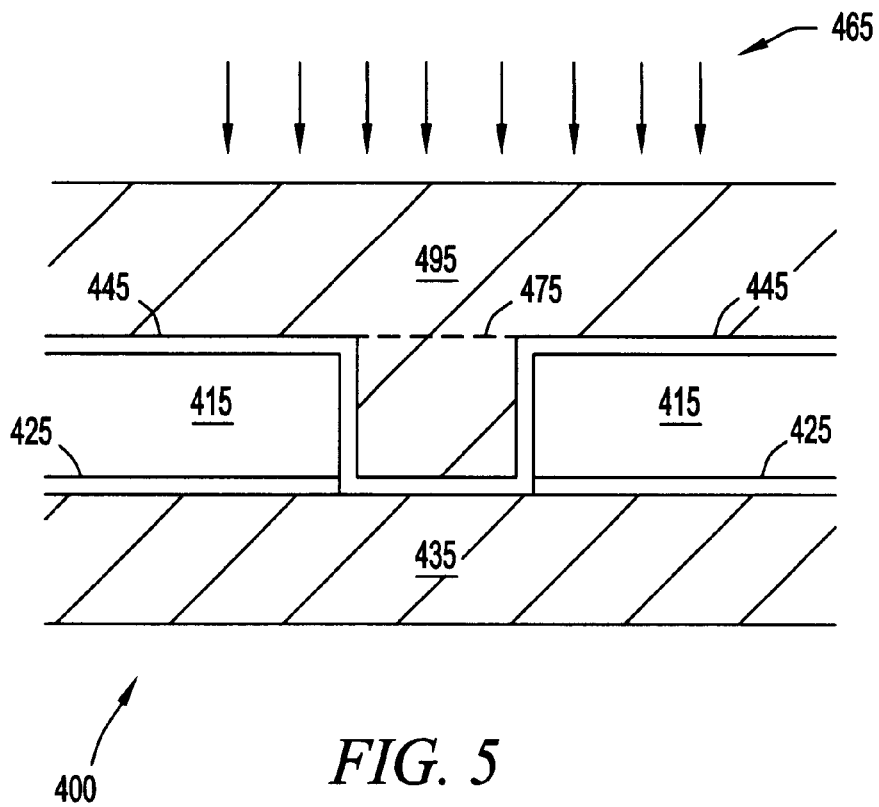
FIG. 5 is a perspective cross-sectional view representation of a portion of an integrated circuit, showing a fast diffusing insert in accordance with an exemplary embodiment.

Referring now to FIG. 5, after barrier layer 445 receives alloy element 455 as an implant, an alloy element 465 can be provided. In an exemplary embodiment, alloy element 465 is inserted after copper fill of an overburden layer 495 in aperture 405. Alloy element 465 can also be inserted during electro chemical deposition (ECD) fill of the via and trench with copper. The amount of alloy element 465 inserted can be a dose of 2 $e^{14}$/cm$^2$ or 2 $e^{15}$/cm$^2$ and inserted at an energy of, for example, 0.5 to 5 keV.

Alloy element 465 can be a fast diffuser, such as, Tin (Sn), Calcium (Ca), Zinc (Zn), or other suitable material. As a fast diffuser, alloy element 465 diffuses during the deposition and annealing of via 470 to a top interface 475. Advantageously, alloy element 465 can reduce interface diffusion. Interface diffusion is where diffusion occurs along the copper silicon nitride interface.

Figure 6:
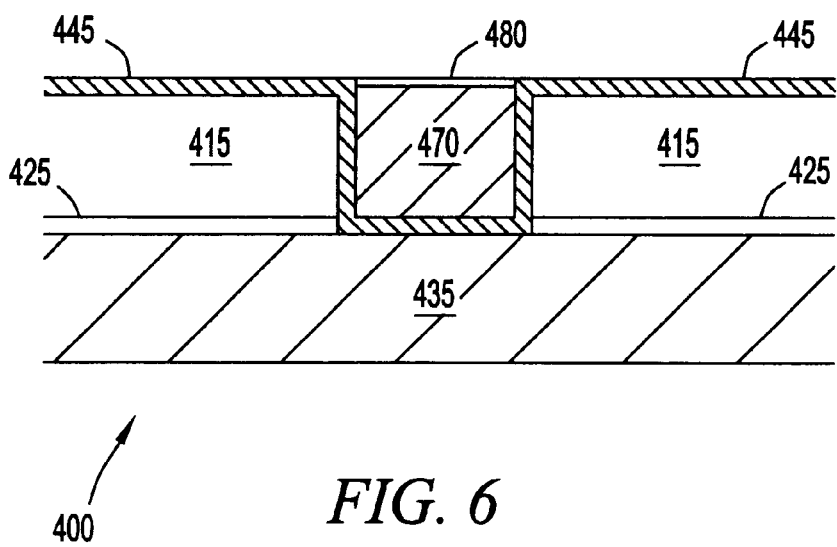
FIG. 6 is a perspective cross-sectional view representation of a portion of an integrated circuit in accordance with an exemplary embodiment.

Referring now to FIG. 6, alloy element 465 is included after an annealing process to get alloy element at an interface 480 of via 470. A chemical mechanical polish (CMP) can be provided to level off via 470 at interface 480.

Advantageously, making barrier layer 445 more resistant to copper diffusion is good for preventing electromigration. Further, having more than one copper (Cu) alloy element allows for the introduction of a second alloy element which is selected as a faster diffuser than the first alloy element such that it locates at a top interface of the via. Benefits to use of this dual alloy element process further include improving resistance of the barrier to copper diffusion. Thus, the barrier can be thinner. With a thinner barrier, more of the copper line cross-sectional is composed of low resistance copper material.

While the exemplary embodiments illustrated in the figures and described above are presently preferred, it should be understood that these embodiments are offered by way of example only. Other embodiments may include, for example, different methods of implanting species. The invention is not limited to a particular embodiment, but extends to various modifications, combinations, and permutations that nevertheless fall within the scope and spirit of the appended claims.

What is claimed is:

1. A method of fabricating an integrated circuit, the method comprising:

forming a barrier material layer along lateral side walls and a bottom of a via aperture, the via aperture being configured to receive a via material that electrically connects a first conductive layer and a second conductive layer;

implanting a first alloy element into the barrier material layer, the implanted first alloy element making the barrier material layer more resistant to copper diffusion and implanting a second alloy element into the via material after deposition of the via material, the implanted second alloy element diffusing to a top interface and reducing interface diffusion.

2. The method of claim 1, wherein the implanted first alloy element is selected from a group of metals which upon implanting make the barrier material layer amorphous.

3. The method of claim 1, where in the barrier material layer is Tantalum (Ta), Titanium Nitride (TiN), titanium Silicon Nitride (TiSiN) or Tungsten Nitride (WNx).

4. The method of claim 1, wherein the implanted first alloy element is selected from a group consisting of Zirconium (Zr), Lanthanum (La), and Hafnium (Hf).

5. The method of claim 1, wherein the first alloy element is implanted at a dose of $2\ e^{14}/cm^2$ or $2\ e^{15}/cm^2$ at an energy of 0.5 to 5 keV.

6. The method of claim 1, wherein the implanted second alloy element is selected from a group consisting of Tin (Sn), Calcium (Ca), and Zinc (Zn).

7. The method of claim 1, wherein the second alloy element is implanted at a dose of $2\ e^{14}/cm^2$ or $2\ e^{15}/cm^2$ at an energy of 0.5 to 5 keV.

8. The method of claim 1, wherein the barrier material layer has a thickness of 25 to 250 Angstroms.

9. The method of claim 1, wherein the barrier material layer forms an intermetallic with the second conductive layer, the second conductive layer including copper.

10. A method of implanting copper barrier material to improve electrical performance in an integrated circuit fabrication process, the method comprising:

providing a copper layer over an integrated circuit substrate;

providing a barrier material at a bottom and sides of a via aperture positioned over the copper layer to form a barrier material layer separating the via aperture from the copper layer;

amorphizing the barrier material layer, thereby making the barrier material layer more resistant to copper diffusion from the copper layer; and filling the via aperture with a via material and an implanted slow diffusing alloy element that diffuses to a top interface of the via material.

11. The method of claim 10, wherein the amorphizing step includes implanting a low dose metal species.

12. The method of claim 10, further comprising providing a conductive layer over the via material such that the via material electrically connects the conductive layer to the copper layer.

13. The method of claim 10, wherein the implanted slow diffusing alloy element is selected from a group consisting of Zirconium (Zr), Lanthanum (La), and Hafnium (Hf).

14. The method of claim 10, wherein the barrier material layer has a thickness of 25 to 250 Angstroms.

15. A method of forming a via in an integrated circuit, the method comprising:

depositing a copper layer;

depositing an etch stop layer over the copper layer;

depositing an insulating layer over the etch stop layer;

forming an aperture in the insulating layer and the etch stop layer;

providing a barrier material at a bottom and sides of the apertures to form a barrier material layer providing separation from the copper layer;

implanting a first alloy element into the barrier material layer, the implanted first alloy element making the barrier material layer more resistant to copper diffusion from the copper layer;

filling the aperture with a via material and implanting a second alloy element into the via material to form a via, the second alloy element diffusing to a top interface of the via; and providing a conductive layer over the via such that the via electrically connects the conductive layer to the copper layer.

16. The method of claim 15, wherein the second alloy element reduces interface diffusion.

17. The method of claim 15, further comprising providing a chemical mechanical polish to level the via material in the aperture.

18. The method of claim 15, wherein the barrier material layer has a cross-sectional thickness of 25 to 80 Angstroms.

19. The method of claim 15, wherein the barrier material layer and the copper layer form an intermetallic.

20. The method of claim 15, wherein the implanted second alloy element is selected from a group consisting of Tin (Sn), Calcium (Ca), and Zinc (Zn).

* * * * *

UNITED STATES PATENT AND TRADEMARK OFFICE
CERTIFICATE OF CORRECTION

PATENT NO. : 6,703,308 B1
DATED : March 9, 2004
INVENTOR(S) : Paul R. Besser et al.

It is certified that error appears in the above-identified patent and that said Letters Patent is hereby corrected as shown below:

<u>Column 5,</u>
Line 8, delete "where in" and replace it with -- wherein --.

<u>Column 6,</u>
Line 18, change "apertures" to -- aperture --.

Signed and Sealed this

Fifteenth Day of June, 2004

JON W. DUDAS
*Acting Director of the United States Patent and Trademark Office*